United States Patent
Liu et al.

(10) Patent No.: US 11,124,614 B2
(45) Date of Patent: Sep. 21, 2021

(54) HALOGEN-FREE LOW DIELECTRIC RESIN COMPOSITION, AND PRE-PREG, METAL-CLAD LAMINATE, AND PRINTED CIRCUIT BOARD USING THE SAME

(71) Applicant: TAIWAN UNION TECHNOLOGY CORPORATION, Chupei (TW)

(72) Inventors: Shur-Fen Liu, Chupei (TW); Chin-Hsien Hung, Chupei (TW); Meng-Huei Chen, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 367 days.

(21) Appl. No.: 16/214,821

(22) Filed: Dec. 10, 2018

(65) Prior Publication Data

US 2020/0071477 A1 Mar. 5, 2020

(30) Foreign Application Priority Data

Aug. 28, 2018 (TW) .................. 107130020

(51) Int. Cl.
| | | |
|---|---|---|
| *C08J 5/24* | (2006.01) | |
| *C08K 5/5399* | (2006.01) | |
| *C08K 3/36* | (2006.01) | |
| *C08K 13/02* | (2006.01) | |
| *C08L 71/12* | (2006.01) | |
| *H05K 1/03* | (2006.01) | |
| *H05K 3/02* | (2006.01) | |
| *C08G 65/38* | (2006.01) | |

(52) U.S. Cl.
CPC .............. *C08J 5/24* (2013.01); *C08G 65/38* (2013.01); *C08K 3/36* (2013.01); *C08K 5/5399* (2013.01); *C08K 13/02* (2013.01); *C08L 71/126* (2013.01); *H05K 1/0373* (2013.01); *H05K 3/022* (2013.01); *C08J 2371/12* (2013.01); *C08J 2471/12* (2013.01); *C08L 2201/02* (2013.01); *C08L 2203/20* (2013.01); *C08L 2205/025* (2013.01); *C08L 2205/03* (2013.01); *C08L 2312/00* (2013.01); *H05K 2201/012* (2013.01)

(58) Field of Classification Search
CPC ...... C08K 5/5399; C08L 71/12; C08L 71/126
See application file for complete search history.

(56) References Cited

U.S. PATENT DOCUMENTS

| | | |
|---|---|---|
| 5,218,030 A | 6/1993 | Katayose et al. |
| 5,352,745 A | 10/1994 | Katayose et al. |
| 6,352,782 B2 | 3/2002 | Veager et al. |
| 6,524,717 B1 | 2/2003 | Takano et al. |
| 6,528,559 B1 | 3/2003 | Nakacho et al. |
| 6,995,195 B2 | 2/2006 | Ishii et al. |
| 2011/0130497 A1 | 6/2011 | Su et al. |
| 2014/0349090 A1 | 11/2014 | Hsieh |
| 2016/0280913 A1 | 9/2016 | Liu et al. |
| 2018/0163023 A1 | 6/2018 | Liao et al. |

FOREIGN PATENT DOCUMENTS

WO   WO-2020013263 A1 *  1/2020 ............... C08K 5/49

OTHER PUBLICATIONS

Partial machine translation of WO-2020013263-A1 (2020).*
Taiwanese Office Action from Taiwanese Patent Application No. 107130020, dated Jun. 28, 2019.
Allcock et al., "Phosphonitrilic Compounds V. Cyclized Products from the Reactions of Hexachlorocyclotriphosphazene (Phosphonitrilic Chloride Trimer) with Aromatic Dihydroxy, Dithiol, and Diamino Compounds", Inorganic Chemistry (1966), 5(6), pp. 1016-1020.
Shin et al., "Flame Retardant Properties of Cyclotriphosphazene Derivatives for ABS", Polymers & Polymer Composites (2018), 26(4), pp. 309-314.

* cited by examiner

*Primary Examiner* — Kregg T Brooks
(74) *Attorney, Agent, or Firm* — Greer, Burns & Crain, Ltd.

(57) ABSTRACT

A halogen-free low dielectric resin composition is provided. The halogen-free low dielectric resin composition includes:
(A) a polyphenylene ether which has an unsaturated functional group;
(B) a cross-linking agent which has an unsaturated functional group; and
(C) a phosphorus-containing compound represented by the following formula (I),

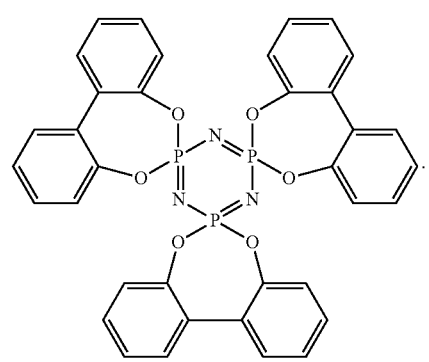

formula (I)

17 Claims, No Drawings

HALOGEN-FREE LOW DIELECTRIC RESIN COMPOSITION, AND PRE-PREG, METAL-CLAD LAMINATE, AND PRINTED CIRCUIT BOARD USING THE SAME

CLAIM FOR PRIORITY

This application claims the benefit of Taiwan Patent Application No. 107130020 filed on Aug. 28, 2018, the subject matters of which are incorporated herein in their entirety by reference.

BACKGROUND

Field of the Invention

The present invention provides a halogen-free low dielectric resin composition, especially a polyphenylene ether resin composition of halogen-free electronic materials having the following advantages: a low dielectric constant (Dk), a low dissipation factor (Df), a low coefficient of thermal expansion and high dimensional stability. The halogen-free low dielectric resin composition of the present invention can be used in combination with glass fibers to constitute a composite material or prepreg. Furthermore, it can be used as a metal foil adhesive to manufacture a resin-coated copper (RCC), a metal-clad laminate, a printed circuit board (PCB) and so on.

Descriptions of the Related Art

Recently, in the field of electronic telecommunications, electronic products have been designed to operate at higher frequencies and speeds due to the increasing amount of data transmission; therefore, the dielectric properties of the related electronic materials need to be enhanced. In consideration of the trends of high-frequency and high-speed signal transmission, the miniaturization of electronic elements, and high-density wiring of PCBs, there is a big need for electronic materials with low dielectric properties, but conventional electronic materials are increasingly failing to meet this need.

Furthermore, due to growing environmental awareness, halogen-containing flame retardants are gradually being replaced by halogen-free flame retardants, such as metal hydroxides, nitrogen-containing compounds, phosphorus-containing compounds, etc. However, when using conventional halogen-free flame retardants in a resin composition, the dielectric properties of the prepared electronic materials usually degrade. For example, the prepared electronic materials usually have higher Dk values or Df values. If the formation of the resin composition is adjusted to maintain good dielectric properties of the electronic materials, the physical properties of the electronic materials may often degrade. For example, the peeling strength, dimensional stability or heat resistance may degrade. Therefore, there is a need for a high-frequency, halogen-free electronic material with low Dk and Df values, while having satisfactory physical properties.

SUMMARY

The problem to be solved by the present invention is that conventional halogen-free electronic materials do not simultaneously exhibit satisfactory high-frequency dielectric properties, heat resistance and dimensional stability, which makes it difficult for the prepared metal-clad laminates or printed circuit boards to meet the requirements especially with regard to the high temperature aging test. To this end, the present invention provides a halogen-free low dielectric resin composition whereby an electronic material prepared therefrom can have good high-frequency dielectric properties (for example, a measured Dk value less than 4.0 and a measured Df value less than 0.006 at 10 GHz) and good high-temperature resistance, such that the electronic material can meet the requirements especially with regard to the high temperature aging test.

As described in the following objectives of the present invention, the technical means applied in the present invention for solving the problems of the prior art is to use a phosphorus-containing compound having a specific structure in the polyphenylene ether resin composition. The halogen-free electronic material prepared from the halogen-free low dielectric resin composition of the present invention (herein also called the resin composition of the present invention) possesses not only high-temperature resistance and dimensional stability, but also lower Dk and Df values. Therefore, the electronic material prepared from the resin composition of the present invention is particularly suitable for high-frequency applications and can meet the high requirements of materials for advanced telecommunication applications. Examples of the high-frequency applications include but are not limited to 5th generation mobile networks (usually called 5G networks), advanced driver assistance systems (ADAS), and artificial intelligence (AI) applications.

An objective of the present invention is to provide a halogen-free low dielectric resin composition, which comprises the following components:

(A) a polyphenylene ether resin having an unsaturated functional group;

(B) a cross-linking agent having an unsaturated functional group; and (C) a phosphorus-containing compound represented by the following formula (I):

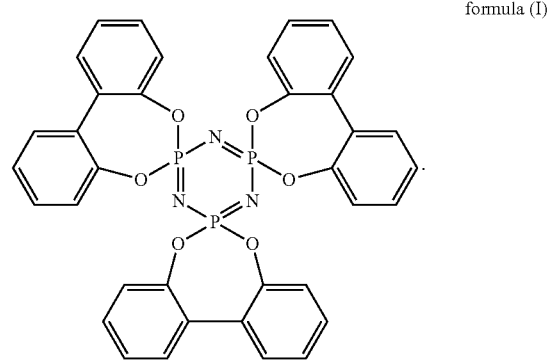 [SMILES: c1ccc2c(c1)OP1(=NP3(=NP4(=N1)Oc1ccccc1-c1ccccc1O4)Oc1ccccc1-c1ccccc1O3)Oc1ccccc1-2]

formula (I)

In some embodiments addressing this foregoing objective of the present invention, the halogen-free low dielectric resin composition further comprises a reactive phosphorus compound having an unsaturated functional group In some embodiments of the present invention, the weight ratio of the phosphorus-containing compound (C) represented by formula (I) to the reactive phosphorus compound is from 4:1 to 1:4.

In some embodiments of the present invention, the reative phosphorus compound is an ally cyclophosphazene compound.

In some embodiments of the present invention, the polyphenylene ether resin (A) is represented by the following formula (II):

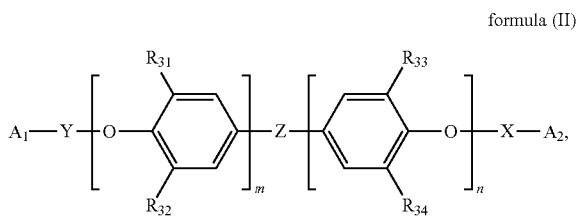

formula (II)

wherein, $R_{31}$, $R_{32}$, $R_{33}$ and $R_{34}$ are independently H, or a substituted or unsubstituted C1-C5 alkyl;

$A_1$ and $A_2$ are independently

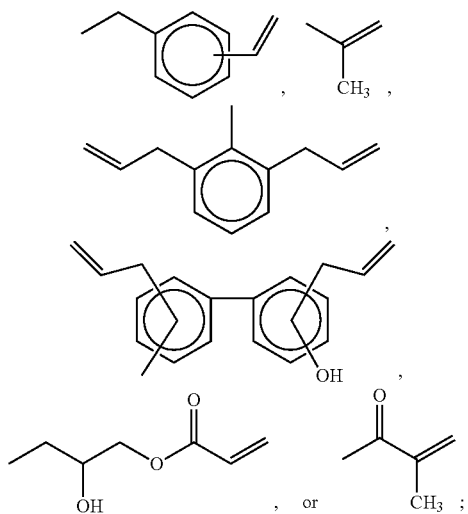

X and Y are independently absent, or carbonyl or an alkenyl-containing group;

m and n are independently an integer from 0 to 100, with the proviso that m and n are not 0 at the same time; and Z is absent, or aryl, —O—,

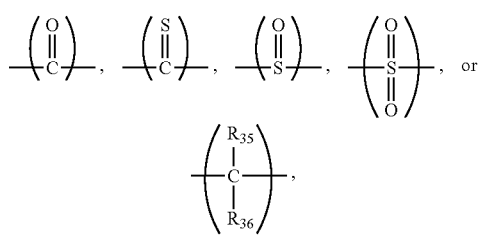

wherein $R_{35}$ and $R_{36}$ are independently H or a C1-C12 alkyl.

In some embodiments of the present invention, the cross-linking agent (B) is selected from the group consisting of a polyfunctional allylic compound, a polyfunctional acrylate, a polyfunctional acrylamide, a polyfunctional styrenic compound, a bismaleimide compound, and combinations thereof.

In some embodiments of the present invention, the cross-linking agent (B) is selected from the group consisting of triallyl isocyanurate (TAIC), triallyl cyanurate (TAC), prepolymers thereof, and combinations thereof.

In some embodiments of the present invention, the halogen-free low dielectric resin composition further comprises a phosphorus-containing additive flame retardant selected from the group consisting of a phosphinate salt, a polyphosphate salt, a phosphonium salt, a phosphate ester, a phosphazene, a phosphite ester, a phosphine oxide, and combinations thereof.

In some embodiments of the present invention, the halogen-free low dielectric resin composition further comprises a vinyl-containing elastomer selected from the group consisting of polybutadiene, styrene-butadiene (SB) copolymer, styrene-butadiene-styrene (SBS) di/tri-block copolymer, polyisoprene, styrene-isoprene copolymer, styrene-isoprene-styrene (SIS) block copolymer, acrylonitrile-butadiene copolymer, acrylonitrile-butadiene-styrene block copolymer, and combinations thereof. When the halogen-free low dielectric resin composition includes a vinyl-containing elastomer, the cross-linking agent (B) is preferably a bismaleimide compound.

In some embodiments of the present invention, the halogen-free low dielectric resin composition further comprises a filler selected from the group consisting of silica (for example, spherical silica, fused silica, non-fused silica, porous silica, or hollow silica), aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

In some embodiments of the present invention, based on the total weight of the resin solid content, the amount of the phosphorus-containing compound (C) represented by formula (I) is 1 wt % to 50 wt %.

In some embodiments of the present invention, the weight ratio of the polyphenylene ether resin (A) to the cross-linking agent (B) is from 3:1 to 1:1.

Another objective of the present invention is to provide a prepreg, which is prepared by impregnating a substrate with the abovementioned resin composition or by coating the abovementioned resin composition onto a substrate, and drying the impregnated or coated substrate.

Yet another objective of the present invention is to provide a metal-clad laminate, which is prepared by laminating the abovementioned prepreg and a metal foil, or by directly coating the abovementioned resin composition onto a metal foil and drying the coated metal foil.

Yet another objective of the present invention is to provide a printed circuit board, which is prepared from the abovementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DETAILED DESCRIPTION

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing constituents in a solution, mixture or composition in the specification, the amount of each constituent is calculated based on the dry weight, i.e., regardless of the weight of the solvent.

As used herein, the term "resin solid content" refers to all the other solid components excluding fillers in the resin composition. That is, the resin solid content includes a polyphenylene ether resin, a cross-linking agent, a phosphorus-containing compound represented by formula (I) as necessary components, and optional components (for example, a reative phosphorus compound, a phosphorus-containing additive flame retardant, and a vinyl-containing elastomer).

As used herein, the term "halogen-free" refers to a resin composition substantially free of halogen, especially chlorine (Cl) and bromine (Br) to comply with the halogen-free standard for electronic products defined by the International Electrotechnical Commission (IEC). IEC-61249-2-21 defines "halogen-free" for electronic products as follows: Br<900 ppm, Cl<900 ppm, and (Cl+Br)<1500 ppm.

Compared with the prior art, the distinguishing feature of the present invention lies in that the halogen-free low dielectric resin composition of the present invention includes a phosphorus-containing compound with a specific structure, which can impart good high-temperature resistance to the prepared electronic material. In addition, compared with other resin compositions having a phosphorus-containing compound without having the structure of formula (I), the resin composition of the present invention can improve the dielectric properties of electronic materials without sacrificing the physicochemical properties and heat resistance properties of the prepared electronic materials, to thus solve the problems of conventional resin compositions. Detailed descriptions for each component of the halogen-free low dielectric resin composition and the preparation method of the resin composition are provided as follows.

1. RESIN COMPOSITION

The resin composition of the present invention comprises a polyphenylene ether resin having an unsaturated functional group (A), a cross-linking agent (B) having an unsaturated functional group and a phosphorus-containing compound (C) represented by formula (I) as necessary components, and other optional components that may be used depending on the need. Detailed description for each component of the resin composition are provided as follows.

1.1. Polyphenylene Ether Resin (A)

As used herein, a polyphenylene ether resin refers to a resin having at least a repeating unit

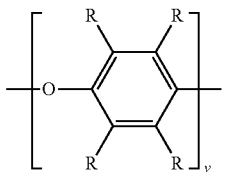

in the main chain and having an unsaturated functional group at the terminal, wherein Rs are independently H or a C1-C5 alkyl, and v is an integer ranging from 1 to 100. The unsaturated functional group refers to a group capable of carrying out addition polymerization with other components having an unsaturated functional group, and the addition polymerization reaction can be initiated by light or heat in the presence of a polymerization initiator. Examples of the unsaturated functional group include but are not limited to vinyl, vinyl benzyl, allyl, acryloyl, acrylate, and methacrylate. Examples of the polyphenylene ether resin having an unsaturated functional group include but are not limited to a vinyl-containing polyphenylene ether resin, an allyl-containing polyphenylene ether resin, a vinyl benzyl-containing polyphenylene ether resin, an acryloyl-containing polyphenylene ether resin, an acrylate-containing polyphenylene ether resin and a methacrylate-containing polyphenylene ether resin. Each of the polyphenylene ether resin having an unsaturated functional group can either be used alone or in any combination.

The method for preparing the polyphenylene ether resin having an unsaturated functional group is not the technical feature of the present invention, and persons having ordinary skill in the art can conduct the method based on the disclosure of the present invention and ordinary skill. The related methods for preparing the polyphenylene ether resin having an unsaturated functional group are described in, for example, U.S. Pat. No. 6,995,195 B2 for vinyl-containing polyphenylene ether resins, U.S. Pat. No. 5,218,030 A for vinyl-containing polyphenylene ether resins, U.S. Pat. No. 5,352,754 A for allyl-containing polyphenylene ether resins, U.S. Pat. No. 6,352,782 B2 for methacrylate-containing polyphenylene ether resins, and US 2016/0280913 A1, all of which are incorporated herein in their entireties by reference.

Examples of commercially available polyphenylene ether resin (A) having an unsaturated functional group include CPE-2ST and OPE-2EA available from MITSUBISHI GAS CHEMICAL company, SA-9000 available from SABIC company, PP807 available from Chin Yee Chemical Industry company, and a polyphenylene ether resin available from ASAHI KASEI company.

In some embodiments of the present invention, the polyphenylene ether resin (A) having an unsaturated functional group is represented by the following formula (II).

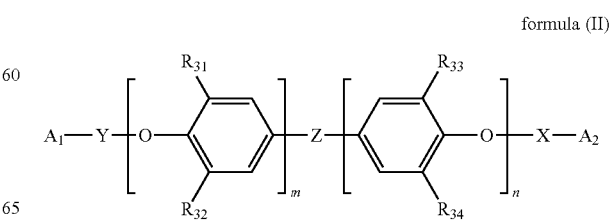

formula (II)

In formula (II), $R_{31}$, $R_{32}$, $R_{33}$ and $R_{34}$ are independently H, or a substituted or unsubstituted C1-C5 alkyl, and preferably —$CH_3$; $A_1$ and $A_2$ are independently

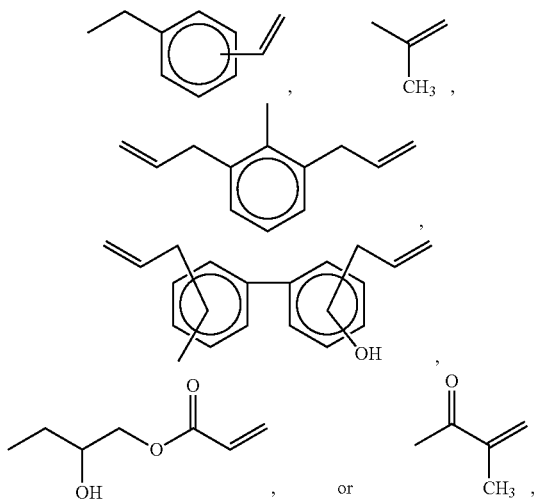

and preferably

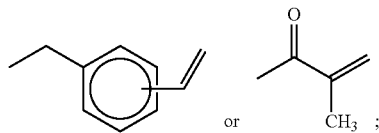

X and Y are independently absent, or carbonyl or an alkenyl-containing group, and preferably absent; m and n are independently an integer from 0 to 100, with the proviso that m and n are not 0 at the same time; and Z is absent, or aryl, —O—,

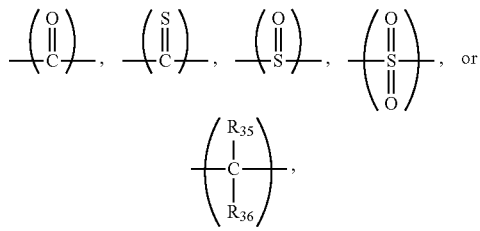

wherein $R_{35}$ and $R_{36}$ are independently H or a C1-C12 alkyl, and Z is preferably

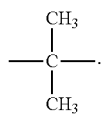

In the resin composition of the present invention, the polyphenylene ether resin (A) having an unsaturated functional group may have a weight average molecular weight (Mw) from 1000 to 50,000, preferably from 1000 to 10,000, and more preferably from 1000 to 5000. If the Mw of the polyphenylene ether resin is greater than the abovementioned range, the properties of the resin composition, such as fluidity, solubility, etc., may degrade, which makes it difficult for subsequent processing. On the other hand, if the Mw of the polyphenylene ether resin is less than the abovementioned range, the electrical properties and thermal stability of the resin composition may degrade.

In the resin composition of the present invention, based on the total weight of the resin solid content, the amount of the polyphenylene ether resin (A) having an unsaturated functional group can range from 30 wt % to 65 wt %, and more specifically from 35 wt % to 60 wt %, such as 36 wt %, 37 wt %, 38 wt %, 39 wt %, 40 wt %, 41 wt %, 42 wt %, 43 wt %, 45 wt %, 47 wt %, 48 wt %, 50 wt %, 52 wt %, 53 wt %, 55 wt %, 56 wt %, 58 wt %, or 59 wt %.

1.2. Cross-Linking Agent (B)

As used herein, a cross-linking agent refers to a component having an unsaturated functional group and being capable of undergoing crosslinking reaction with a polyphenylene ether resin to form a stereo network structure, wherein the unsaturated functional group is as defined above. In the resin composition of the present invention, the cross-linking agent preferably has good compatibility with the polyphenylene ether resin, such that the formed resin composition can have a good appearance after curing. In general, the cross-linking agent having an unsaturated functional group may be classified into a monofunctional cross-linking agent and a polyfunctional cross-linking agent depending on the amount of the unsaturated functional group, wherein the monofunctional cross-linking agent has only an unsaturated functional group, and the polyfunctional cross-linking agent has at least two unsaturated functional groups. In some embodiments of the present invention, in order that the resin composition has a higher crosslinking density after curing, it is preferred to use a polyfunctional cross-linking agent.

Examples of the polyfunctional cross-linking agent include but are not limited to a polyfunctional allyl-based compound, a polyfunctional acrylate, a polyfunctional styrene-based compound, a bismaleimide compound, and a polyfunctional acrylamide. Each mentioned polyfunctional cross-linking agent can either be used alone or in any combination.

As used herein, a polyfunctional allyl-based compound refers to a compound containing at least two allyl groups. Examples of the polyfunctional allyl-based compound include but are not limited to diallyl phthalate, diallyl isophthalate, triallyl trimellitate, triallyl mesate, triallyl isocyanurate (TAIC), triallyl cyanurate (TAC), and prepolymers thereof.

As used herein, a polyfunctional acrylate refers to a compound containing at least two acrylate groups. Examples of the polyfunctional acrylate include but are not limited to trimethylolpropane tri(meth)acrylate, 1,6-hexanediol di(meth)acrylate, ethylene glycol di(meth)acrylate, propylene glycol di(meth)acrylate, 1,3-butanediol di(meth)acrylate, 1,4-butanediol di(meth)acrylate, cyclohexane dimethanol di(meth)acrylate, diethylene glycol di(meth)acrylate, triethylene glycol di(meth)acrylate, and prepolymers thereof.

As used herein, a polyfunctional styrene-based compound refers to a compound having at least two alkenyl groups attached to the aromatic ring. Examples of the polyfunctional styrene-based compound include but are not limited to 1,3-divinylbenzene, 1,4-divinylbenzene, trivinylbenzene, 1,3-diisopropenylbenzene, 1,4-diisopropenylbenzene, 1,2-bis(p-vinylphenyl)ethane, 1,2-bis(m-vinylphenyl)ethane, 1-(p-vinylphenyl)-2-(m-vinylphenyl)-ethane, 1,4-bis(p-vinylphenylethyl)benzene, 1,4-bis(m-vinylphenyl ethyl)benzene, 1,3-bis(p-vinylphenylethyl)benzene, 1,3-bis(m-vinylphenyl ethyl)benzene, 1-(p-vinylphenylethyl)-4-(m-vinylphenylethyl) benzene, 1-(p-vinylphenylethyl)-3-(m-vinylphenylethyl)benzene, and prepolymers thereof.

As used herein, a bismaleimide compound refers to a compound having at least two of maleimide functional groups. A maleimide functional group has reactive double bonds and thus can react with other components having unsaturated functional groups. In some embodiments of the present invention, the bismaleimide compound is represented by the following formula (III):

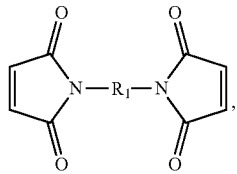

formula (III).

In formula (III), R₁ is an organic group and preferably selected from the following group consisting of: methylene (—CH₂—), 4,4'-diphenylmethane

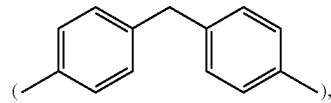

m-phenylene

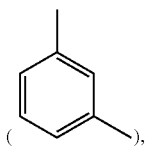

bisphenol A diphenyl ether

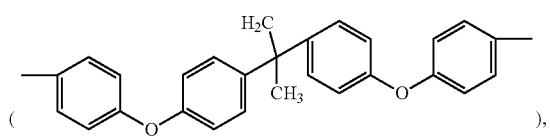

3,3'-dimethyl-5,5'-diethyl-4,4'-diphenylmethane group

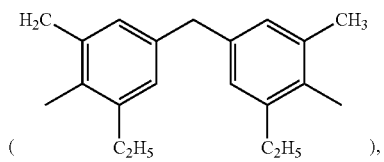

4-methyl-1,3-phenylene

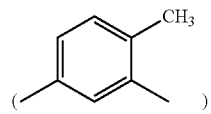

and 2,2,4-trimethyl-1,6-hexylene

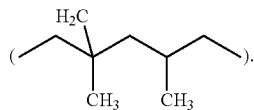

Specific examples of the bismaleimide compound include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α, α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene)bismaleimide. Commercially available bismaleimide resins include BMI-70 and BMI-80 available from KI Chemical company and BMI-1000, BMI-4000, BMI-5000, BMI-5100, BMI-7000, BMI-2000 and BMI-2300 (CAS 67784-74-1) available from Daiwa Fine Chemical company. The aforementioned bismaleimide can either be used alone or in any combination, and persons with ordinary skill in the art could adjust the amount of the bismaleimide depending on the need. In the appended examples, 3,3'-dimethyl-5,5'-diethyl-4,4'-diphenylmethyl-bismaleimide (that is, in formlua (III), R₁ is 3,3'-dimethyl-5,5'-diethyl-4,4'-diphenylmethyl group

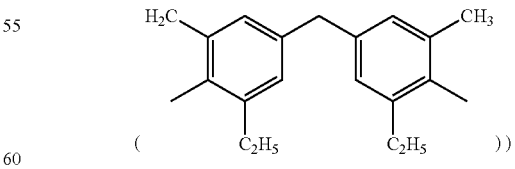

is used.

Considering the compatibility between the components of the resin composition, the cross-linking agent (B) is preferably selected from the following group consisting of: TAIC, TAC, 1,3-divinylbenzene, 1,4-divinylbenzene, 1,2-bis(p-vinylphenyl)ethane, 1,2-bis(m-vinylphenyl)ethane, 1-(p-vinylphenyl)-2-(m-vinylphenyl)-ethane, 3,3'-dimethyl-5,5'-diethyl-4,4'-diphenylmethylbismaleimide, and combinations thereof.

In the resin composition of the present invention, the cross-linking agent (B) having an unsaturated functional group may have a Mw from 100 to 50,000, preferably from 100 to 4000, and more preferably from 100 to 3000. If the Mw of the cross-linking agent is greater than the abovementioned range, the viscosity (such as dynamic viscosity) of the resin composition may be too high, which is disadvantageous for subsequent processing. If the Mw of the cross-linking agent is less than the abovementioned range, the cross-linking agent is easily volatilized during the curing of the resin composition, and the components in the resin composition may not maintain the desired ratio after curing.

In the resin composition of the present invention, the weight ratio of the polyphenylene ether resin (A) having an unsaturated functional group to the cross-linking agent (B) having an unsaturated functional group may be from 95:5 to 5:95, preferably from 90:10 to 30:70, more preferably 90:10 to 50:50, and particularly preferably 90:10 to 60:40. If the weight ratio of the polyphenylene ether resin is too low (that is, the weight ratio of the cross-linking agent is too high), for example, less than the abovementioned range, the prepared electronic material may not have good dielectric properties. If the weight ratio of the polyphenylene ether resin is too high (that is, the weight ratio of the cross-linking agent is too low), for example, higher than the abovementioned range, the crosslinking density of the resin composition after curing may be insufficient, thereby adversly affecting the heat resistance and dimensional stability of the prepared electronic materials.

In the resin composition of the present invention, based on the total weight of the resin solid content, the amount of the cross-linking agent (B) having an unsaturated functional group can range from 10 wt % to 35 wt %, and more specifically from 12 wt % to 33 wt %, such as 13 wt %, 14 wt %, 15 wt %, 16 wt %, 17 wt %, 18 wt %, 19 wt %, 20 wt %, 21 wt %, 23 wt %, 24 wt %, 25 wt %, 26 wt %, 27 wt %, 28 wt %, 29 wt %, 30 wt %, or 32 wt %.

1.2. Phosphorus-Containing Compound (C) Represented by Formula (I)

The resin composition of the present invention comprises a phosphorus-containing compound (C) represented by the following formula (I):

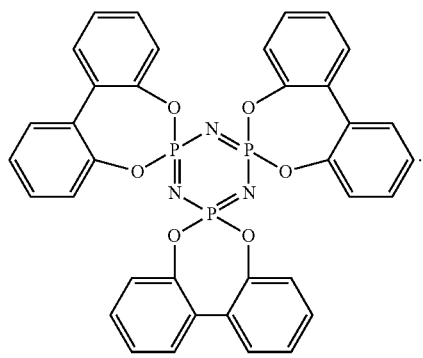

formula (I)

The phosphorus-containing compound represented by formula (I) is a derivative of a phosphazene compound, specifically tri-(2,2'-dihydroxybiphenyl) cyclophosphazene (CAS 6800-71-1). In the resin composition, the phosphorus-containing compound represented by formula (I) is an additive component and does not undergo chemical reactions with other components in the resin composition.

In general, a phosphorus-containing compound often used in the resin composition usually has a love melting point, for instance commercially available hexaphenoxy cyclotriphosphazene (e.g. SPB-100 available from Otsuka Chemical company) only has a melting point from 100° C. to 120° C. In contrast, the phosphorus-containing compound represented by formula (I) used in the resin composition of the present invention has a melting point higher than 260° C. Without being bound by theory, it is believed that this high melting point results from the phosphorus-containing compound of formula (I) having a very rigid biphenyl structure and a plurality of cyclic structures. It has been found that, by including the phosphorus-containing compound of formula (I) and the polyphenylene ether resin (A) having an unsaturated functional group in the resin composition of the present invention, the electronic material prepared therefrom can have not only excellent high-temperature resistance but also low coefficient of thermal expansion to have excellent dimensional stability.

The phosphorus-containing compound represented by formula (I) can be prepared by reacting hexachloro cyclophosphazene

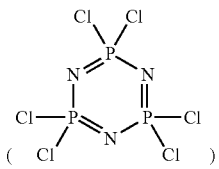

with 2,2'-dihydroxy biphenyl

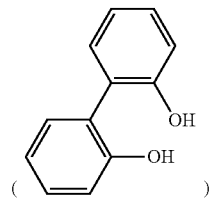 [SMILES: Oc1ccccc1-c1ccccc1O]

at an appropriate ratio followed by further purification. Detailed description for the preparation method of the phosphorus-containing compound represented by formula (I) can be also found in, for example, US 2011/0130497 and TW 445276, all of which are incorporated herein in their entireties by reference. Commercially available phosphorus-containing compound represented by formula (I) include BP-PZ available from Otsuka Chemical company.

In the resin composition of the present invention, based on the total weight of the resin solid content, the amount of the phosphorus-containing compound (C) represented by formula (I) can range from 1 wt % to 50 wt %, and more specifically from 1.5 wt % to 45 wt %, such as 2 wt %, 2.5 wt %, 3 wt %, 4 wt %, 5 wt %, 6 wt %, 7 wt %, 8 wt %, 9 wt %, 10 wt %, 12 wt %, 13 wt %, 14 wt %, 15 wt %, 16 wt %, 17 wt %, 18 wt %, 19 wt %, 20 wt %, 21 wt %, 22 wt %, 24 wt %, 25 wt %, 26 wt %, 28 wt %, 30 wt %, 32 wt %, 33 wt %, 35 wt %, 36 wt %, 38 wt %, 40 wt %, 41 wt %, 42 wt %, or 43 wt %. In addition, the amount of the phosphorus-containing compound represented by formula (I) is preferably used in an amount so that the total amount of the phosphorus atoms in the resin composition is at least 1 wt %, and more preferably from 1 wt % to 6 wt %, based on the total weight of the resin solid content, to allow the prepared electronic material to have good flame retardance, as well as good moisture resistance, dielectric properties and peeling strength, all at the same time.

1.4. Other Optional Components (D)

The resin composition of the present invention may optionally further comprise other optional components, such as elastomers, phosphorus-containing additive flame retardants, phosphorus-containing reactive flame retardants, fillers, epoxy resins and additives well-known to persons having ordinary skill in the art, as illustrated below, to adaptively improve the workability of the resin composition during manufacturing or the physicochemical properties of the electronic material prepared from the resin composition. The additives well-known to persons having ordinary skill in the art include but are not limited to curing agents, curing accelerators and dispersing agents.

1.4.1. Vinyl-Containing Elastomer

As used herein, an elastomer refers to a polymer having viscoelasticity which imparts toughness to an electronic material. In some embodiments of the present invention, the resin composition further includes a vinyl-containing, elastomer which can undergo a crosslinking reaction with other components having an unsaturated functional group, such that the prepared electronic material has better toughness and lower Dk and Df values.

In general, a vinyl-containing, elastomer is formed by polymerization of monomers having carbon-carbon unsaturated bonds, and a pendant vinyl group is present on the main chain of the polymer or a branch or a terminal group thereof, wherein the pendant vinyl content usually expressed as a percentage is preferably greater than 10%, and more preferably greater than 50%.

The vinyl-containing elastomer may be, for example, a homopolymer polymerized from conjugated-diene monomers, and a copolymer copolymerized from a conjugated-diene monomers and other monomers. The Mw of the vinyl-containing elastomer may be from 200 to 100,000, preferably from 1000 to 5000, and more preferably from 1000 to 3000. Examples of the conjugated-diene monomers include butadiene and isoprene, and examples of other monomers include styrene and maleic anhydride.

The vinyl-containing elastomer may be selected from but are not limited to polybutadiene, styrene-butadiene copolymer, styrene-butadiene-styrene (SBS) di/tri block copolymer, polyisoprene, styrene-isoprene copolymer, styrene-isoprene-styrene (SIS) di/tri block copolymer, acrylonitrile-butadiene copolymer, acrylonitrile-butadiene-styrene block copolymer, and combinations thereof.

Commercially available vinyl-containing elastomers include Ricon 150, Ricon 100, Ricon 181, Ricon 184, Ricon 104H, Ricon 250, Ricon 257, Ricon 157, Ricon 130, Ricon 130MA and Ricon 184MA available from Cray Valley company, B3000 available from Nippon Soda company, and Kraton DX1300 available from Shell Oil company.

In some embodiments of the present invention, when the resin composition includes a vinyl-containing elastomer, the cross-linking agent (B) is preferably a bismaleimide compound. The vinyl-containing elastomer and the bismaleimide compound can exhibit good synergistic complementariness, such that the prepared electronic material provides both good dielectric properties and heat resistance.

In the resin composition of the present invention, the weight ratio of the polyphenylene ether resin (A) having an unsaturated functional group to the vinyl-containing elastomer is preferably from 90:10 to 50:50, and more preferably from 70:30 to 60:40. If the weight ratio of the vinyl-containing elastomer is too high (for example, higher than the abovementioned range), the heat resistance and the dimensional stability of the prepared electronic material may decrease. If the weight ratio of the vinyl-containing elastomer is too low (for example, less than the abovementioned range), the vinyl-containing elastomer is insufficient to provide the desired toughening effect, which may result in the deterioration of the physical properties of the prepared electronic material.

In the resin composition of the present invention, based on the total weight of the resin solid content, the amount of the vinyl-containing elastomer can range from 0 wt % to 35 wt %, and more particularly from 10 wt % to 30 wt %, such as 12 wt %, 15 wt %, 18 wt %, 20 wt %, 21 wt %, 22 wt %, 23 wt %, 25 wt %, 27 wt %, or 28 wt %.

1.4.2. Phosphorus-Containing Additive Flame Retardant

The resin composition of the present invention may optionally further comprise phosphorus-containing additive flame retardants to improve the heat resistance and the dimensional stability. As used herein, a phosphorus-containing additive flame retardant refers to a phosphorus-containing compound without reactive unsaturated functional groups and without the structure of formula (I). In order to meet the halogen-free requirements of the resin composition of the present invention, the phosphorus-containing additive flame retardant is preferably free of halogen. Examples of the phosphorus-containing additive flame retardant include but are not limited to phosphinate, polyphosphate, phosphonium salt, phosphate ester, phosphazene, phosphite ester, and phosphine oxide.

Examples of the phosphinate include but are not limited to aluminum dialkylphosphinate, aluminum tris(diethylphosphinate), aluminum tris(methylethylphosphinate), aluminum tris(diphenylphosphinate), zinc bis(diethylphosphinate), zinc bis(methylethylphosphinate), zinc bis(diphenylphosphinate), titanyl bis(diethylphosphinate), titanyl bis(methylethylphosphinate), and titanyl bis(diphenylphosphinate). One commercially available phosphinate is OP935 available from CLARIANT company.

Examples of the polyphosphate include but are not limited to melamine polyphosphate, melam polyphosphate, and melem polyphosphate. One commercially available polyphosphate is Melapur 200, available from BASF company.

An example of the phosphonium salt is, but is not limited to tetraphenylphosphonium tetraphenylborate. Examples of the phosphate ester include but are not limited to a condensed phosphate ester compound, and a cyclic phosphate ester compound. Examples of the condensed phosphate ester compound include but are not limited to triphenyl phosphate, tricresyl phosphate, xylenyl-diphenyl phosphate, cresyl-diphenyl phosphate, resorcinol bis-xylenylphosphate (RXP), resorcinol bis-diphenylphosphate (RDP), and 9,10-dihydro-9-oxa-10-phosphaphenanthrene-10-oxide (DOPO). Commercially available phosphate esters include PX-200 and PX-202 available from Daihachi Chemical Iudustry company, and CG-686 and CG-RDP available from Chembridge company.

The phosphazene may be a cyclic phosphazene compound and a linear phosphazene compound. Commercially available phosphazenes include SPB-100 and SPH-100, both available from Otsuka Chemical company. Examples of the phosphite ester include but are not limited to trimethylphosphite, and triethylphosphite. Examples of the phosphine oxide include but are not limited to tris-(4-methoxyphenyl) phosphine oxide, triphenyl phosphine oxide, diphenyl phosphine oxide, and derivatives thereof. Commercially available phosphine oxides include PQ-60, available from Chin Yee Chemical industry company, and BPO-13 and BPE-3, available from Katayama Chemical Industries company.

In the resin composition of the present invention, based on the total weight of the resin solid content, the amount of the phosphorus-containing additive flame retardant can range from 0 wt % to 25 wt %, and more particularly from 5 wt % to 20 wt %, such as 6 wt %, 7 wt %, 8 wt %, 10 wt %, 12 wt %, 13 wt %, 15 wt %, 17 wt %, or 18 wt %. In addition, the amount of the phosphorus-containing additive flame retardant and the phosphorus-containing compound represented by formula (I) are preferably used in an amount such that the total amount of the phosphorus atoms in the resin composition is at least 1 wt %, and more preferably from 1 wt % to 6 wt %, based on the total weight of the resin solid content, in order to allow the prepared electronic material to have good flame retardance, as well as good moisture resistance, dielectric properties and peeling strength, all at the same time.

1.4.3. Phosphorus-Containing Reactive Flame Retardant

The resin composition of the present invention may optionally further comprise phosphorus-containing reactive flame retardants to improve the heat resistance and the dimensional stability. As used herein, a phosphorus-containing reactive flame retardant refers to a phosphorus-containing flame retardant having reactive unsaturated functional groups. To meet the halogen-free requirements of the resin composition of the present invention, the phosphorus-containing reactive flame retardant is preferably free of halogen. Examples of the phosphorus-containing reactive flame retardant include but are not limited to an unsaturated functional group-containing phosphorus compound, such as an allylic cyclic phosphazene compound. Commercially available phosphorus-containing reactive flame retardant is SPV-100, available from Otsuka Chemical company.

It has been found that compared with the combination of the phosphorus-containing compound (C) represented by formula (I) and the phosphorus-containing additive flame retardant, the combination of the phosphorus-containing compound (C) represented by formula (I) and the phosphorus-containing reactive flame retardant can provide superior overall properties of the prepared electronic materials, and particularly provide excellent balance among dimensional stability, heat resistance and peeling strength. In addition, the weight ratio of the phosphorus-containing compound (C) represented by formula (I) to the phosphorus-containing reactive flame retardant is preferably from 4:1 to 1:4. When the weight ratio is within the above specified range, the prepared electronic material can have good flame retardance, and can also have the highest peeling strength and dimensional stability at the same time.

In the resin composition of the present invention, based on the total weight of the resin solid content, the amount of the phosphorus-containing reactive flame retardant can range from 0 wt % to 50 wt %, and more particularly from 1 wt % to 40 wt %, such as 2 wt %, 3 wt %, 4 wt %, 5 wt %, 7 wt %, 8 wt %, 9 wt %, 10 wt %, 11 wt %, 12 wt %, 13 wt %, 15 wt %, 17 wt %, 18 wt %, 19 wt %, 20 wt %, 22 wt %, 23 wt %, 24 wt %, 25 wt %, 27 wt %, 28 wt %, 30 wt %, 32 wt %, 33 wt %, 35 wt %, 36 wt %, 37 wt %, or 39 wt %. In addition, the amount of the phosphorus-containing reactive flame retardant and the phosphorus-containing compound represented by formula (I) are preferably used in an amount such that the total amount of the phosphorus atoms in the resin composition is at least 1 wt %, and more preferably from 1 wt % to 6 wt %, based on the total weight of the resin solid content, to allow the prepared electronic material to have good flame retardance, as well as good moisture resistance, dielectric properties and peeling strength, all at the same time.

1.4.4. Filler

The resin composition of the present invention may optionally further comprise a filler to improve the mechanical strength, the thermal conductivity and the dimensional stability of the prepared electronic materials. Examples of the suitable filler include but are not limited to silica (for example, spherical silica, fused silica, non-fused silica, porous silica, or hollow silica), aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof. For providing the low Dk and Df electronic materials that the present invention is particularly targeted at, it is preferred to use silica or boron nitride.

In the resin composition of the present invention, the shape of the filler is not particularly limited and may be, for example, a spherical shape, a fibrous shape, a plate shape, a granular shape, a sheet shape a whiskered shape, or the like, but the present invention is not limited thereto. In general, the size of the filler is not particularly limited, but to improve the effect of the filler and the quality of the prepared electronic material, the size of the filler should not be too large. In the case of a spherical or granular filler, the average particle diameter is generally less than 10 µm, preferably less than 5 µm, and more preferably less than 2.5 µm.

In addition, to increase the compatibility between the filler and other components of the resin composition, and the workability of the resin composition, the filler may be surface-modified with a coupling agent before being added into the resin composition. Examples of the coupling agent include but are not limited to a silane coupling agent, a titanate coupling agent, a zirconate coupling agent, and a poly-siloxane coupling agent. Examples of the silane coupling agent include but are not limited to epoxy silane, amino silane, vinyl silane, and acrylate silane. Considering the reactivity with a polyphenylene ether resin having an unsaturated functional group, it is preferred to use the vinyl silane as a coupling agent for surface-modification of the filler. Examples of the vinyl silane include but are not limited to vinyltrimethoxy silane and vinyltriethoxy silane. The method for surface-modifying the filler is not a technical feature of the present invention, and can be easily accomplished by persons having ordinary skill in the art based on the disclosure of the present invention and the ordinary skill. Detailed description for the surface-modification method of the filler can be also found in, for example, U.S. Pat. No. 6,524,717 B1, the subject matter of which is incorporated herein in its entirety by reference.

Commercially available fillers include the Admafuse series, the Admafine series, and the Admanano series of silica products, and SC1050, SC2050, SC4050, SC5500, and SE2050, available from Admatechs company.

In the resin composition of the present invention, based on the total weight of the resin composition, the amount of the filler can range from 0 wt % to 40 wt %, and more particularly from 5 wt % to 35 wt %, such as 7 wt %, 8 wt %, 10 wt %, 12 wt %, 13 wt %, 15 wt %, 17 wt %, 18 wt %, 20 wt %, 21 wt %, 22 wt %, 23 wt %, 24 wt %, 25 wt %, 26 wt %, 27 wt %, 28 wt %, 29 wt %, 30 wt %, 32 wt %, or 34 wt %.

1.4.5. Polymerization Initiator

The resin composition of the present invention may optionally further comprise polymerization initiators to assist with inducing polymerization. Examples of the polymerization initiators include but are not limited to azobisisobutyronitrile, azobis(2-isopropyl)butyronitrile, azobisisoheptonitrile, dibenzoyl peroxide, acetylisobutyryl peroxide, diacetyl peroxide, 2,4-dichlorobenzoyl peroxide, 2-dimethylbenzoyl peroxide, lauroyl peroxide, diisopropyl peroxydicarbonate, bis(3,5,5-trimethylhexanoyl) peroxide, cyclohexanone peroxide, methyl ethyl ketone peroxide, dicyclohexylpropyl peroxydicarbonate, dicyclohexyl peroxydicarbonate, bis(4-tert-butylcyclohexyl) peroxydicarbonate, bis(2-ethylhexyl) peroxydicarbonate, bis(2-phenylethoxy) peroxydicarbonate, dihexadecyl peroxydicarbonate, tert-butyl peroxybenzoate, tert-butyl peroxyphenylacetate, peracetic acid, tert-butyl peroxypivalate, tert-hexyl peroxypivalate, cumyl peroxyneodecanoate, tert-butyl hydroperoxide, cumene hydroperoxide, p-menthane hydroperoxide, dicumyl peroxide, ditert-butyl peroxide, hydrogen peroxide, ammonium persulfate, potassium persulfate, peroxide-alkyl metal, and oxy-alkyl metal.

Commercially available polymerization initiator include PERBUTYL P, PERHEXA 25B, and PERHEXYNE 25B, both available from Nippon Oil & Fats (NOF) company. In the resin composition of the present invention, based on the total weight of the resin solid content, the amount of the polymerization initiator can range from 0 wt % to 3 wt %, and more particularly from 0.05 wt % to 2.5 wt %, such as 0.07 wt %, 0.08 wt %, 0.09 wt %, 1.0 wt %, 1.1 wt %, 1.2 wt %, 1.3 wt %, 1.4 wt %, 1.5 wt %, 1.6 wt %, 1.7 wt %, 1.8 wt %, 1.9 wt %, 2.0 wt %, 2.1 wt %, 2.2 wt %, 2.3 wt %, or 2.4 wt %.

1.4.6. Epoxy Resin

The resin composition of the present invention may optionally further comprise an epoxy resin to improve the physicochemical properties of the prepared electronic material. As used herein, an epoxy resin refers to a thermal hardening resin with at least two epoxy functional groups in each molecule, including but being not limited to a bifunctional epoxy resin, a tetrafunctional epoxy resin, an octafunctional epoxy resin, or a linear phenolic epoxy resin. In the resin composition of the present invention, the type of the epoxy resin is not particularly limited. The epoxy resin can be used by persons having ordinary skill in the art depending on the need based on the disclosure of the present invention. However, in order to meet the halogen-free requirements of the resin composition of the present invention, the epoxy resin should be a halogen-free epoxy resin, and particularly a bromine-free epoxy resin.

To avoid adverse effects on the dielectric properties and heat resistance of the prepared electronic material, it is preferred to use an epoxy resin having a high glass transition temperature (Tg), low Dk and low Df. For example, a dicyclopentadiene (DCPD)-typed epoxy resin may be used.

1.4.7. Curing Agent and Curing Accelerator

In the case that the resin composition comprises an epoxy resin, a curing agent and a curing accelerator may be further added to promote the ring-opening reaction of epoxy functional groups and lower the curing reaction temperature. The type of the curing agent is not particularly limited as long as it can promote the ring-opening reaction of epoxy functional groups and lower the curing reaction temperature. The curing agent is suitably selected from but are not limited to an OH group-containing compound, an amine-containing compound, an acid anhydride compound, and an active ester compound, wherein each mentioned curing agent can either be used alone or in combination. Examples of the curing agent include but are not limited to phenolic resin, styrene maleic anhydride (SMA), dicyandiamide, diaminophenylsulfone, dianilinomethane, phenolic resin, aromatic diamine, aromatic dianhydride, aliphatic dianhydride, benzoxazine resin, cyanate resin, phenolic triazine resin, and copolymer of styrene and vinylphenol. In general, based on the total weight of the resin solid content, the amount of the curing agent can range from 5 wt % to 25 wt %, but the present invention is not limited thereto. Persons with ordinary skill in the art can adjust the amount of the curing agent depending on the need.

The curing accelerator is suitably selected from but are not limited to a tertiary amine, a quaternary ammonium salt, a imidazole, or a pyridine, wherein each mentioned curing accelerator can either be used alone or in combination. Examples of the pyridine include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, or 2-amino-3-nitropyridine. In general, based on the total weight of the resin solid content, the amount of the curing accelerator can range from 0.55 wt % to 5 wt %, but the present invention is not limited thereto. Persons with ordinary skill in the art can adjust the amount of the curing accelerator depending on the need.

1.5. Preparation of Resin Composition

The resin composition of the present invention may be prepared into a varnish for subsequent applications by evenly mixing the polyphenylene ether resin, the cross-linking agent, the phosphorus-containing compound represented by formula (I) and other optional components through a stirrer, and dissolving or dispersing the obtained mixture into a solvent. The solvent here can be any inert solvent that can dissolve or disperse the components of the resin composition of the present invention but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP), wherein each mentioned solvent can either be used alone or in combination. The amount of the solvent is not particularly limited as long as the components of the resin composition can be evenly dissolved or dispersed therein. In some embodiments of the present invention, a mixture of toluene, methyl ethyl ketone and γ-butyrolactone is used as the solvent.

2. PREPREG

The present invention also provides a prepreg prepared from the abovementioned resin composition, wherein the prepreg is prepared by impregnating a substrate with the abovementioned resin composition or by coating the abovementioned resin composition onto a substrate and drying the impregnated or coated substrate. The method for preparing the prepreg is not particularly limited, and can be easily accomplished by persons having ordinary skill in the art based on the disclosure of the present invention and the ordinary skill. Specifically, the method for impregnating or coating resin compositions include but are limited to impregnating, roll coating, die coating, bar coating, and spraying. The impregnated or coated substrate can be dried at a temperature of 80° C. to 180° C. for 1 to 10 minutes to obtain a semi-cured (B-stage) prepreg.

The ordinary substrates comprise glass fiber reinforcing materials (e.g., glass-fiber woven fabrics, glass papers, glass mats, etc.), kraft papers, short fiber cotton papers, nature fiber cloths, and organic fiber cloths. Examples of the substrate include but are not limited to woven fabrics, non-woven fabrics, glass roving cloths, glass cloths, chopped glass fibers, hollow glass fibers, glass mats, glass surfacing mats, non-woven glass fabrics, and ceramic fiber fabrics. Examples of the raw material that can be used to form the substrate include but are not limited to E-glass fiber, NE-glass fiber, S-glass fiber, L-glass fiber, T-glass fiber, D-glass fiber, quartz, aramid, and liquid crystal polymer. Considering the dielectric properties of the prepared electronic material, it is preferred to use a substrate having a low Df value, such as a substrate composed of E-glass fiber, NE-glass fiber, S-glass fiber, and L-glass fiber.

In some embodiments of the present invention, a 2116 glass fiber cloth is used as the substrate. The substrate is heated and dried at 175° C. for 2 to 15 minutes (B-stage) to provide a semi-cured prepreg.

3. METAL-CLAD LAMINATE AND PRINTED CIRCUIT BOARD

The present invention also provides a metal-clad laminate prepared from the abovementioned prepreg, which comprises a dielectric layer and a metal layer. The metal-clad laminate can be prepared by laminating the abovementioned prepreg and a metal foil, or by coating the resin composition onto a metal foil and then drying the coated metal foil, wherein the dielectric layer is provided by the abovementioned prepreg. In the case of the preparation of the metal-clad laminate by using the prepreg, the metal-clad laminate can be prepared by superimposing a plurality of the abovementioned prepregs, superimposing a metal foil (such as a copper foil) on at least one external surface of the dielectric layer composed of the superimposed prepregs to provide a superimposed object, and then performing a hot-pressing operation onto the superimposed object to obtain the metal-clad laminate.

Furthermore, the abovementioned metal-clad laminate can form a printed circuit board by further patterning the external metal foil thereof.

4. EXAMPLES 4.1. Testing Method

The present invention is further illustrated by the embodiments hereinafter, wherein the testing instruments and methods are as follows:

[Dielectric constant (Dk) and dissipation factor (Df) measurement]

The dielectric constant (Dk) and dissipation factor (Df) of the metal-clad laminate are measured according to IPC-TM-650 2.5.5.13 under an operating frequency of 10 GHz. The resin content (RC) of the tested prepreg in the metal-clad laminate is about 54%.

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties. The ranking for the flame retardance level is V0>V1>V2.

[Dimensional Stability Test]

A sample to be tested is prepared by laminating four prepregs. According to IPC-TM-650 2.4.24.5, the dimensional stability test is carried out by using a thermal mechanical analyzer (TMA) to measure the coefficient of thermal expansion (CTE) $\alpha 1$ and the rate of change of the coefficient of thermal expansion in the Z-axis direction (total z-CTE) of the sample to be tested at temperatures below Tg thereof. The $\alpha 1$ is measured in a temperature range from 50° C. to 120° C., and the unit thereof is ppm/° C. The total z-CTE is measured in the temperature range from 50° C. to 260° C., and the unit thereof is %.

[Peeling Strength Test]

The peeling strength refers to the bonding strength between the metal foil and hot-pressed laminated prepreg and is expressed as the force required to vertically peel clad copper foil with a width of ⅛ inch from the surface of the hot-pressed laminated prepreg. The unit of the peeling strength is pounds per inch (lbf/in).

[Heat Resistance Test]

A heat resistance test is carried out by immersing the dried metal-clad laminate in a solder bath at 288° C. for 100 seconds, repeating the abovementioned immersion three times, and subsequently measuring the peeling strength for heat resistance of the metal-clad laminate. Then, the decrease in the peeling strength for the heat resistance of the metal-clad laminate is calculated by comparing it to that of a metal-clad laminate that has not been immersed in the solder bath (hereinafter called "original peeling strength"). If the decrease in the peeling strength for heat resistance is 5% or less of the original peeling strength, it indicates that the heat resistance is excellent, and the test result is recorded as "○"; if the decrease in the peeling strength for heat resistance is 6% to 15% of the original peeling strength, it indicates that the heat resistance is normal, and the test result is recorded as "Δ"; and if the decrease in the peeling strength for heat resistance is 16% or more of the original peeling strength, it indicates that the heat resistance is not good, and the test result is recorded as "X".

4.2. Raw Materials Used in Examples and Comparative Examples List:

TABLE 1

| Raw Materials List | |
|---|---|
| Model No. | Description |
| OPE-2st | Polyphenylene ether resin having an unsaturated functional group, available from Mitsubishi Gas Chemical Company |
| SA9000 | Polyphenylene ether resin having an unsaturated functional group, available from Saudi Basic Industry Corporation (SABIC) |
| TAIC | Cross-linking agent, triallyl isocyanurate, available from Evonik Company |
| BMI 5100 | Cross-linking agent, bismaleimide, available from Daiwa Fine Chemical Company |
| BP-PZ | Phosphorus-containing compound represented by formula (I), available from Otsuka Chemical Company, phosphorus content: 13% |
| Ricon 150 | Vinyl-containing elastomer, available from Cray Valley Company |
| SPB-100 | Phosphorus-containing additive flame retardant, available from Otsuka Chemical Company, phosphorus content: 13% |

TABLE 1-continued

Raw Materials List

| Model No. | Description |
|---|---|
| PX-200 | Phosphorus-containing additive flame retardant, available from Daihachi Chemical Iudustry Company, phosphorus content: 9% |
| SPV-100 | Phosphorus-containing reactive flame retardant, available from Otsuka Chemical Company, phosphorus content: 13% |
| SC-5500 SVJ | Silica filler surface-modified with vinyl silane, available from Admatechs Company, average particle diameter being 1.51 μm |
| Perbutyl P | Polymerization initiator, available from Nippon Oil & Fats Company |

4.3. Preparation of Resin Composition

The resin compositions of Examples 1 to 16 and Comparative Examples 1 to 5 were prepared according to the constitutions shown in Tables 2-1 to 2-3, and 3, wherein each of the components was mixed at room temperature with a stirrer, and toluene, methyl ethyl ketone and γ-butyrolactone, all available from Fluka company, as a solvent were added thereinto, followed by stirring of the resultant mixture at room temperature for 60 to 120 minutes, which each of the resin compositions was obtained. The total amount of the phosphorus atoms was calculated based on the resin solid content.

TABLE 2-1

Constitutions of the resin compositions of Examples 1 to 6

| Unit: Parts by weight | | 1 | 2 | 3 | 4 | 5 | 6 |
|---|---|---|---|---|---|---|---|
| Polyphenylene ether resin | OPE-2st | 50 | 50 | 50 | 50 | 50 | 50 |
| Cross-linking agent | BMI 5100 | 20 | 20 | 20 | 20 | 20 | 20 |
| Elastomer | Ricon 150 | 30 | 30 | 30 | 30 | 30 | 30 |
| Phosphorus-containing compound of formula (I) | BP-PZ | 30 | 25 | 25 | 10 | 25 | 10 |
| Phosphorus-containing additive flame retardant | SPB-100 | | 10 | | 25 | | |
| | PX-200 | | | 10 | | | |
| Phosphorus-containing reactive flame retardant | SPV-100 | | | | | 10 | 25 |
| Filler | SC-5500 SVJ | 45 | 45 | 45 | 45 | 45 | 45 |
| Polymerization initiator | Perbutyl P | 2 | 2 | 2 | 2 | 2 | 2 |
| Phosphorus-containing additive compound:phosphorus-containing reactive compound (weight ratio) | | 100:0 | 100:0 | 100:0 | 100:0 | 71:29 | 29:71 |
| Total amount of phosphorus atoms (wt %) | | 3.0 | 3.3 | 3.0 | 3.3 | 3.3 | 3.3 |

TABLE 2-2

Constitutions of the resin compositions of Examples 7 to 12

| Unit: Parts by weight | | 7 | 8 | 9 | 10 | 11 | 12 |
|---|---|---|---|---|---|---|---|
| Polyphenylene ether resin | SA9000 | 35 | 35 | 35 | 35 | 35 | 35 |
| | OPE-2st | 30 | 30 | 30 | 30 | 30 | 30 |
| Cross-linking agent | TAIC | 35 | 35 | 35 | 35 | 35 | 35 |
| Phosphorus-containing compound of formula (I) | BP-PZ | 30 | 15 | 75 | 25 | 25 | 20 |
| Phosphorus-containing additive flame retardant | SPB-100 | | | | 10 | | |
| Phosphorus-containing reactive flame retardant | SPV-100 | | | | | 10 | 15 |
| Filler | SC-5500 SVJ | 45 | 45 | 45 | 45 | 45 | 45 |
| Polymerization initiator | Perbutyl P | 2 | 2 | 2 | 2 | 2 | 2 |
| Phosphorus-containing additive compound:phosphorus-containing reactive compound (weight ratio) | | 100:0 | 100:0 | 100:0 | 100:0 | 71:29 | 57:43 |
| Total amount of phosphorus atoms (wt %) | | 3.0 | 1.7 | 5.5 | 3.3 | 3.4 | 3.3 |

TABLE 2-3

Constitutions of the resin compositions of Examples 13 to 16

| Unit: Parts by weight | | Examples | | | |
|---|---|---|---|---|---|
| | | 13 | 14 | 15 | 16 |
| Polyphenylene ether resin | SA9000 | 35 | 35 | 35 | 35 |
| | OPE-2st | 30 | 30 | 30 | 30 |
| Cross-linking agent | TAIC | 35 | 35 | 35 | 35 |
| Phosphorus-containing compound of formula (I) | BP-PZ | 25 | 10 | 3 | 9 |
| Phosphorus-containing reactive flame retardant | SPV-100 | 5 | 12 | 12 | 35 |
| Filler | SC-5500 SVJ | 45 | 45 | 45 | 45 |
| Polymerization initiator | Perbutyl P | 2 | 2 | 2 | 2 |
| Phosphorus-containing additive compound: phosphorus-containing reactive compound (weight ratio) | | 83:17 | 45:55 | 20:80 | 20:80 |
| Total amount of phosphorus atoms (wt %) | | 3.0 | 2.3 | 1.7 | 4.0 |

TABLE 3

Constitutions of the resin compositions of Comparative Examples

| Unit: Parts by weight | | Comparative Examples | | | | |
|---|---|---|---|---|---|---|
| | | 1 | 2 | 3 | 4 | 5 |
| Polyphenylene ether resin | SA9000 | 50 | 50 | 50 | 50 | 50 |
| Cross-linking agent | BMI 5100 | 20 | 20 | 20 | 20 | 20 |
| Elastomer | Ricon 150 | 30 | 30 | 30 | 30 | 30 |
| Phosphorus-containing additive flame retardant | SPB-100 | | 30 | 25 | | |
| | PX-200 | | | | 20 | |
| Phosphorus-containing reactive flame retardant | SPV-100 | | | 10 | 15 | 35 |
| Filler | SC-5500 SVJ | 45 | 45 | 45 | 45 | 45 |
| Polymerization initiator | Perbutyl P | 2 | 2 | 2 | 2 | 2 |
| Phosphorus-containing additive compound:phosphorus-containing reactive compound (weight ratio) | | | 100:0 | 71:29 | 57:43 | 0:100 |
| Total amount of phosphorus atoms (wt %) | | | 3.0 | 3.3 | 2.7 | 3.3 |

4.4. Preparation and Properties of Metal-Clad Laminate

The metal-clad laminates of Examples 1 to 16 and Comparative Examples 1 to 5 were respectively prepared by using the prepared resin compositions. In detail, one of the resin compositions of Examples 1 to 16 and Comparative Examples 1 to 5 was coated on glass fiber cloths (type: 2116; thickness: 0.08 mm) by a roller at a controlled thickness. The coated glass fiber cloths were then placed in an oven and dried at 175° C. for 2 to 15 minutes to produce prepregs in a half-cured state (B-stage) (the resin content of the prepreg was about 54%). Four pieces of the prepregs were super-imposed and two sheets of copper foil (0.5 oz.) were respectively superimposed on both of the two external surfaces of the superimposed prepregs to provide a superimposed object. A hot-pressing operation was performed on each of the prepared objects. The hot-pressing conditions were as follows: heating to about 200° C. to 220° C. at a heating rate of 3.0° C./min, and hot-pressing for 180 minutes under a full pressure of 15 kg/cm² (initial pressure is 8 kg/cm²) at said temperature.

The properties of the prepregs and metal-clad laminates of Examples 1 to 16 and Comparative Examples 1 to 5, including flame retardance, peeling strength, dielectric constant (Dk), dissipation factor (Df), coefficient of thermal expansion α1, rate of change of coefficient of thermal expansion in the Z-axis direction (total z-CTE), and heat resistance test were measured according to the aforementioned testing methods, and the results are tabulated in Tables 4 and 5.

TABLE 4

Properties of the prepregs and the metal-clad laminates of Examples

| | | Dk | Df | Flame retardance | α1 Unit ppm/°C. | Total z-CTE % | Peeling strength lbf/in | Heat resistance |
|---|---|---|---|---|---|---|---|---|
| Examples | 1 | 3.8 | 0.0043 | V1 | 42 | 2.0 | 3.3 | ○ |
| | 2 | 3.8 | 0.0045 | V0 | 46 | 2.8 | 3.7 | Δ |
| | 3 | 3.8 | 0.0045 | V0 | 41 | 2.7 | 3.6 | Δ |
| | 4 | 3.8 | 0.005 | V0 | 47 | 2.9 | 3.8 | Δ |
| | 5 | 3.8 | 0.0046 | V0 | 34 | 2.1 | 4.1 | ○ |
| | 6 | 3.8 | 0.0047 | V0 | 38 | 2.3 | 4.5 | ○ |
| | 7 | 3.9 | 0.0041 | V1 | 39 | 1.9 | 3.4 | ○ |
| | 8 | 3.9 | 0.0042 | V1 | 41 | 2.2 | 3.5 | ○ |
| | 9 | 3.9 | 0.0040 | V0 | 38 | 1.9 | 3.2 | Δ |
| | 10 | 3.9 | 0.0045 | V0 | 43 | 2.6 | 3.8 | Δ |
| | 11 | 3.9 | 0.0046 | V0 | 35 | 2.0 | 4.3 | ○ |
| | 12 | 3.9 | 0.0046 | V0 | 36 | 2.0 | 4.3 | ○ |
| | 13 | 3.9 | 0.0042 | V0 | 34 | 2.0 | 4.0 | ○ |
| | 14 | 3.9 | 0.0046 | V0 | 37 | 2.5 | 4.3 | ○ |
| | 15 | 3.9 | 0.0047 | V0 | 38 | 2.6 | 4.7 | ○ |
| | 16 | 3.9 | 0.0048 | V0 | 37 | 3.0 | 4.5 | ○ |

TABLE 5

Properties of the prepregs and the metal-clad laminates of Comparative Examples

| | | Dk | Df | Flame retardance | α1 Unit ppm/°C. | Total z-CTE % | Peeling strength lbf/in | Heat resistance |
|---|---|---|---|---|---|---|---|---|
| Comparative Examples | 1 | 3.8 | 0.004 | Burning | 48 | 2.2 | 4.0 | ○ |
| | 2 | 3.8 | 0.005 | V2 | 75 | 4.3 | 4.1 | x |
| | 3 | 3.8 | 0.005 | V1 | 60 | 3.8 | 3.8 | Δ |
| | 4 | 3.8 | 0.005 | V1 | 56 | 3.6 | 3.6 | Δ |
| | 5 | 3.9 | 0.005 | V1 | 51 | 3.5 | 4.3 | ○ |

As shown in Table 4, each of the electronic materials prepared from the halogen-free low dielectric resin composition of the present invention exhibits satisfactory physico-chemical properties and dielectric properties (e.g. peeling strength, flame retardance, Dk, Df, heat resistance, and so on), and possesses excellent dimensional stability (α1 and total z-CTE are low). Furthermore, as shown in Examples 2 to 6 and 10 to 16, when the resin composition of the present invention further comprises a phosphorus-containing additive flame retardant or a phosphorus-containing reactive flame retardant, the flame retardance and the peeling strength of the prepared electronic material can be further improved. In particular, as shown in Examples 5, 6 and 11 to 16, when the resin composition of the present invention further comprises the phosphorus-containing reactive flame retardant, not only can the flame retardance and peeling strength of the prepared electronic materials be further improved, but also, the dimensional stability thereof can be significantly improved.

In contrast, as shown in Table 5, electronic materials prepared by using resin compositions other than that of the present invention cannot achieve a satisfactory level in all physicochemical properties and dielectric properties, and do not have good dimensional stability. Specifically, as shown in Comparative Example 1, when the resin composition does not comprise the phosphorus-containing compound represented by formula (I) and any phosphorus-containing flame retardant, the prepared electronic material does not exhibit flame retardance. As shown in Comparative Example 2, when the resin composition does not comprise the phosphorus-containing compound represented by formula (I) but does comprise the phosphorus-containing additive flame retardant, the flame retardance, heat resistance and dimensional stability of the prepared electronic material are poor. In addition, as shown in Comparative Examples 3 to 5, when the resin compositions do not comprise the phosphorus-containing compound represented by formula (I) but do comprise a phosphorus-containing reactive flame retardant or a combination of a phosphorus-containing additive flame retardant and a phosphorus-containing reactive flame retardant, the prepared electronic materials exhibit acceptable flame retardance, but still do not have satisfactory dimensional stability.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A halogen-free low dielectric resin composition, comprising:
    (A) a polyphenylene ether resin having an unsaturated functional group;
    (B) a cross-linking agent having an unsaturated functional group; and
    (C) a phosphorus-containing compound represented by the following formula (I):

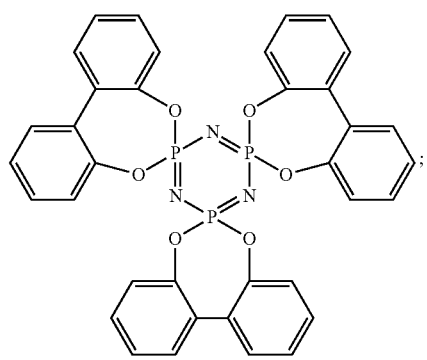

formula (I)

and
a reactive phosphorus compound having an unsaturated functional group, wherein the weight ratio of the phosphorus-containing compound (C) represented by formula (I) to the reactive phosphorus compound is from 4:1 to 1:2.25.

2. The halogen-free low dielectric resin composition of claim 1, wherein the reactive phosphorus compound is an allyl cyclophosphazene compound.

3. The halogen-free low dielectric resin composition of claim 1, wherein the polyphenylene ether resin (A) is represented by the following formula (II):

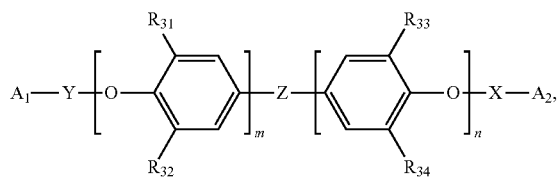

formula (II)

wherein,
$R_{31}$, $R_{32}$, $R_{33}$ and $R_{34}$ are independently H, or a substituted or unsubstituted C1-C5 alkyl;
$A_1$ and $A_2$ are independently

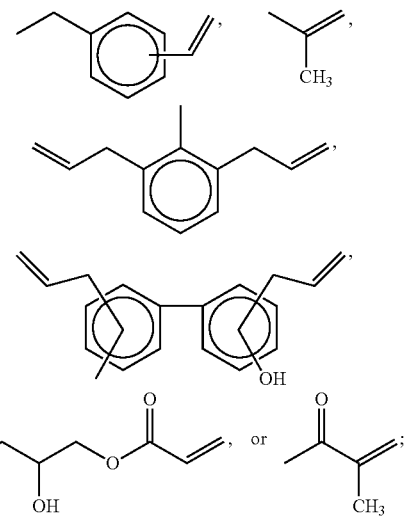

X and Y are independently absent, or carbonyl or an alkenyl-containing group;
m and n are independently an integer from 0 to 100, with the proviso that m and n are not 0 at the same time; and
Z is absent, or aryl, —O—,

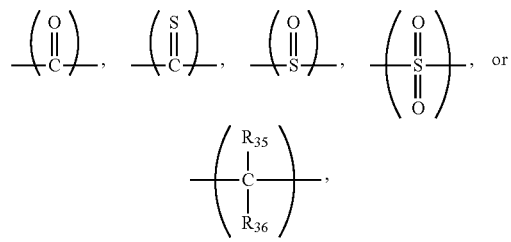

wherein $R_{35}$ and $R_{36}$ are independently H or a C1-C12 alkyl.

4. The halogen-free low dielectric resin composition of claim 1, wherein the cross-linking agent (B) is selected from the group consisting of a polyfunctional allylic compound, a polyfunctional acrylate, a polyfunctional acrylamide, a polyfunctional styrenic compound, a bismaleimide compound, and combinations thereof.

5. The halogen-free low dielectric resin composition of claim 1, wherein the cross-linking agent (B) is selected from the group consisting of triallyl isocyanurate (TAIC), triallyl cyanurate (TAC), prepolymers thereof, and combinations thereof.

6. The halogen-free low dielectric resin composition of claim 1, further comprising a phosphorus-containing additive flame retardant selected from the group consisting of a phosphinate salt, a polyphosphate salt, a phosphonium salt, a phosphate ester, a phosphazene, a phosphite ester, a phosphine oxide, and combinations thereof.

7. The halogen-free low dielectric resin composition of claim 1, further comprising a vinyl-containing elastomer.

8. The halogen-free low dielectric resin composition of claim 7, wherein the vinyl-containing elastomer is selected from the group consisting of polybutadiene, styrene-butadiene (SB) copolymer, styrene-butadiene-styrene (SBS) di/tri-block copolymer, polyisoprene, styrene-isoprene copolymer, styrene-isoprene-styrene (SIS) block copolymer, acrylonitrile-butadiene copolymer, acrylonitrile-butadiene-styrene block copolymer, and combinations thereof.

9. The halogen-free low dielectric resin composition of claim 7, wherein the cross-linking agent (B) is a bismaleimide compound.

10. The halogen-free low dielectric resin composition of claim 1, further comprising a filler selected from the group consisting of silica, aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

11. The halogen-free low dielectric resin composition of claim 1, wherein, based on the total weight of the resin solid content, the amount of the phosphorus-containing compound (C) represented by formula (I) is 1 wt % to 50 wt %.

12. The halogen-free low dielectric resin composition of claim 1, wherein the weight ratio of the polyphenylene ether resin (A) to the cross-linking agent (B) is from 3:1 to 1:1.

13. A prepreg, which is prepared by impregnating a substrate with the halogen-free low dielectric resin composition of claim 1 or by coating the halogen-free low dielectric resin composition of claim 1 onto a substrate and drying the impregnated or coated substrate.

14. A metal-clad laminate, which is prepared by laminating the prepreg of claim 13 and a metal foil.

15. A printed circuit board, which is prepared from the metal-clad laminate of claim 14.

16. A metal-clad laminate, which is prepared by coating the halogen-free low dielectric resin composition of claim 1 onto a metal foil and drying the coated metal foil.

17. A printed circuit board, which is prepared from the metal-clad laminate of claim 16.

\* \* \* \* \*